United States Patent [19]

Lemmer

[11] Patent Number: 4,647,096
[45] Date of Patent: Mar. 3, 1987

[54] DEVICE FOR GRIPPING ELECTRONIC PARTS

[76] Inventor: Alfred Lemmer, Machtlfingerstrasse 24, D-8000 München 70, Fed. Rep. of Germany

[21] Appl. No.: 713,998

[22] Filed: Mar. 20, 1985

[30] Foreign Application Priority Data

Mar. 26, 1984 [DE] Fed. Rep. of Germany ....... 3411125

[51] Int. Cl.$^4$ .............................................. B66C 1/42
[52] U.S. Cl. .................................... 294/87.1; 294/106
[58] Field of Search .................... 294/87.1, 106, 87.11, 294/88, 87.22, 93, 90, 69.1, 67.31, 67.32, 86.4, 67.1; 414/589, 623, 626, 736, 739, 749, 750; 198/484, 486

[56] References Cited

U.S. PATENT DOCUMENTS

| | | | |
|---|---|---|---|
| 3,507,404 | 4/1970 | Pompe | 294/87.1 |
| 4,005,783 | 2/1977 | Pasch | 294/87.1 |
| 4,286,380 | 9/1981 | Blount | 294/87.1 |

Primary Examiner—James B. Marbert
Attorney, Agent, or Firm—Fitzpatrick, Cella, Harper & Scinto

[57] ABSTRACT

The invention relates to a device for gripping electronic parts, particularly IC's with a pincer grip of which the gripping jaws are moveable towards and away from one another. Its object is to design the device so that the dimensions of the pincer grip can be adapted at will to those of the part to be gripped, without the need for exchanging the grip. This is achieved by dividing the pincer grip into a plurality of pincer sections arranged in a row, at least one of the sections being moveable in a first guide between a retracted stand-by position and an advanced operating position.

26 Claims, 4 Drawing Figures

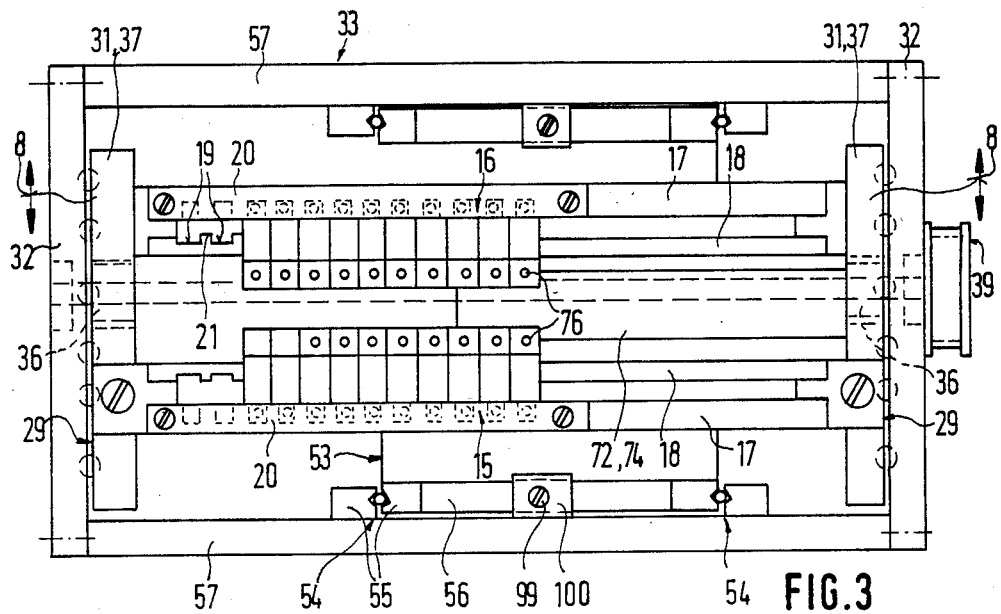
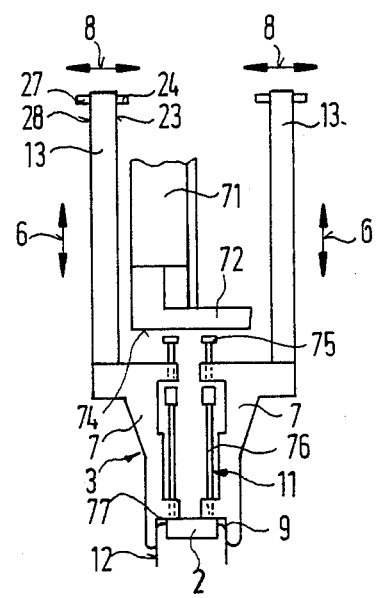

DEVICE FOR GRIPPING ELECTRONIC PARTS

TECHNICAL FIELD OF THE INVENTION

This invention relates to the handling of electronic components and more particularly it concerns a novel gripping device for picking up electronic components in a reliable manner.

BRIEF DESCRIPTION OF THE PRIOR ART

Devices of this kind are used in practice and are therefore known. They serve to load electronic components, particularly circuit boards, with electronic parts, particularly IC's. The loading is done by gripping the electronic parts with the pincer grip of the device at a pick-up station and carrying them to an operating station and delivering them there.

Particularly when the electronic part is not only to be delivered but also mounted by means of the device at the operating station, a relatively firm grip of the part is required in order to prevent it from being tilted or slipping or the like within the pincer grip. Such a danger occurs particularly when parts of relatively great length are held by the gripping faces of the pincer grip only in their middle region, so that on positioning or insertion of the parts unfavourable lever arms are formed which can lead to tilting or slipping of the part in the pincer grip.

What is aimed at therefore is to grip the part over a large area, i.e. the pincer grip should so far as possible grip the part over substantially its whole length.

In practice this requirement is taken into account by using pincer grips of different widths for parts of different lengths, the length of the parts concerned being taken into account in selecting the width of the pincer grip in order to engage it if possible along its whole length.

While it is possible to operate in this way, this is both inconvenient and time-wasting, since both the length and the thickness of the parts can vary greatly. Hence, in the known method frequent changes of the pincer grip are necessary whereby high costs are incurred not only because a large number of pincer grips must be kept available, but also because the output of the device is greatly limited by the exchange of the pincer grip sizes required.

OBJECT OF THE INVENTION

The problem underlying the invention is to construct a device of the kind indicated above so that the dimensions of the pincer grip can be adapted at will to the dimensions of the part to be gripped without exchanging it in the conventional manner.

BRIEF DESCRIPTION OF THE INVENTION

This problem is solved by the features of the present invention.

In the construction according to the invention the pincer grip is divided into a plurality of pincer sections arranged in a row, which can be moved between a retracted stand-by position and an advanced operating position. The construction according to the invention makes it possible to adapt the width of the pincer grip to the length of the part to be gripped by advancing such a number of pincer sections from their retracted stand-by position into the advanced operating position that the width of the pincer grip so obtained corresponds approximately to the length of the part. The part can thus not only be securely gripped but can also be securely mounted, i.e. for example inserted into a circuit board, without it being subjected to objectionable tilting moments, since it is gripped along substantially its whole length.

The adaptability of the pincer grip depends on the width of the pincer sections.

It is preferable to make the pincer sections about 5 mm wide. With such a step length satisfactory adaptability to all possible intermediate lengths of the parts can be obtained.

The construction according to the invention provides a further advantage when it is used for IC's. As is known, IC's have U-shaped contact lugs, which have to be slightly pressed together on inserting an IC into a circuit board of the like in order to bring the points of contact lugs into register with the perforations in the circuit board. This pressing together of the contact lugs is effected by the pincer grip. On gripping IC's it is therefore necessary to engage the IC as far as possible along its whole length not only for the purpose of a secure grip, but also in order to press together all the contact lugs into the desired position. The construction according to the invention is therefore particularly suitable for handling IC's. It has been found that with a step length of about 5 mm for the pincer sections the contact lugs of IC's of different lengths can be reliably acted upon.

The invention in one aspect leads to a simplification of the drive for the pincer sections, in order to move them between the stand-by position and the operating position. Because of the elastic force acting on the pincer sections all that is required is a simple ram.

The invention in other aspects are advantageous since the transverse movement of associated gripping jaws is much simpler to bring about constructionally than an arcuate movement, such as is known in the art. With an arcuate movement of the gripping jaws their longitudinal edges assume different angular positions, so that a first guide needed for the movement between the stand-by position and the operating position can only be constructed with great difficulty. On the other hand, with the construction according to the invention not only can a simple guide be provided, but the gripping faces of the gripping jaws are always parallel, irrespective of the distance between associated gripping jaws, so that the parts can be securely gripped. This advantage is of parcular effect when parts with rectangular sections are to be handled, as is the case with IC's.

The invention in another aspect ensures that in all gripping positions the middle of the part is always in the same place. This is particularly advantageous when a device according to the invention is used for the program-controlled automatic insertion of parts.

The invention in a further aspect leads to a simplification in that the guides of all the gripping jaws in each row are combined in a single guide block. Hence, not only is the second guide substantially simplified, since not all the pincer sections have to be guided, but only two blocks, and not all the pincer sections have to be provided with drives, but only the two guide blocks.

The invention in a still further apsect provides simple and advantageous forms of the first guide, in which not only the features of the guide itself, but also the constructional features for acting on the gripping jaws by means of springs, lead to a space-saving construction.

The invention in yet another aspect provides a simple and likewise space-saving drive for the gripping or releasing movement of the gripping jaws, in which use is made of the proven means of a rack and pinion drive in order to move the guide blocks of the first guide towards and away from one another simultaneously and at the same speed.

Another aspect of the invention relates to the advancement of the pincer sections from their stand-by into their working position by means of a plurality of, or preferably only one ram. For a conceivable number of pincer sections or gripping jaws the arrangements lead to a quite substantial simplification when only one ram is provided that can act on all the pincer sections. With such an embodiment movement of the ram is required both towards the gripping jaws and also along the row of gripping jaws, so that the necessary number of gripping jaws can be advanced at will into the operating position.

One form of the invention makes it possible to form the ram of such a width that it is able to act on the gripping jaws whatever the distance apart of the associated gripping jaws.

Another form of the invention enables the ram to be received into the device when only a narrow pincer grip is needed. In this case the ram is situated in the free space in front of the first gripping jaw section.

Other forms of the invention relate to constructions for ejection of the gripped part from the pincer grip or from the gripping jaws when desired. An ejector is particularly advantageous when the device is used not only for the transport of parts from one place to another, but for mounting, for example for the insertion of IC's into circuit boards. On the one hand ejectors according to the invention prevent the deposited part from sticking to the pincer grip, for example owing to adhesion or clamping effects, and being removed from its destination on withdrawal of the device. On the other hand the ejector can also advantageously be used to eject a part with its contact tags into the mounting position.

The arrangement of the ejector on the gripping jaws has the advantage that the ejector participates in any change in the distance between associated gripping jaws, so that the parts are always acted upon by the ejector at the same distance from their sides.

BRIEF DESCRIPTION OF THE DRAWINGS

An exemplary embodiment of the invention will now be described with reference to a simplified drawing, in which:

FIG. 3 shows a plan view of the device from below; and

FIG. 4 shows two associated gripping jaws of the device with a part gripped therein.

DETAILED DESCRIPTION OF THE PREFERRED EMBODIMENTS OF THE INVENTION

Figure 1:
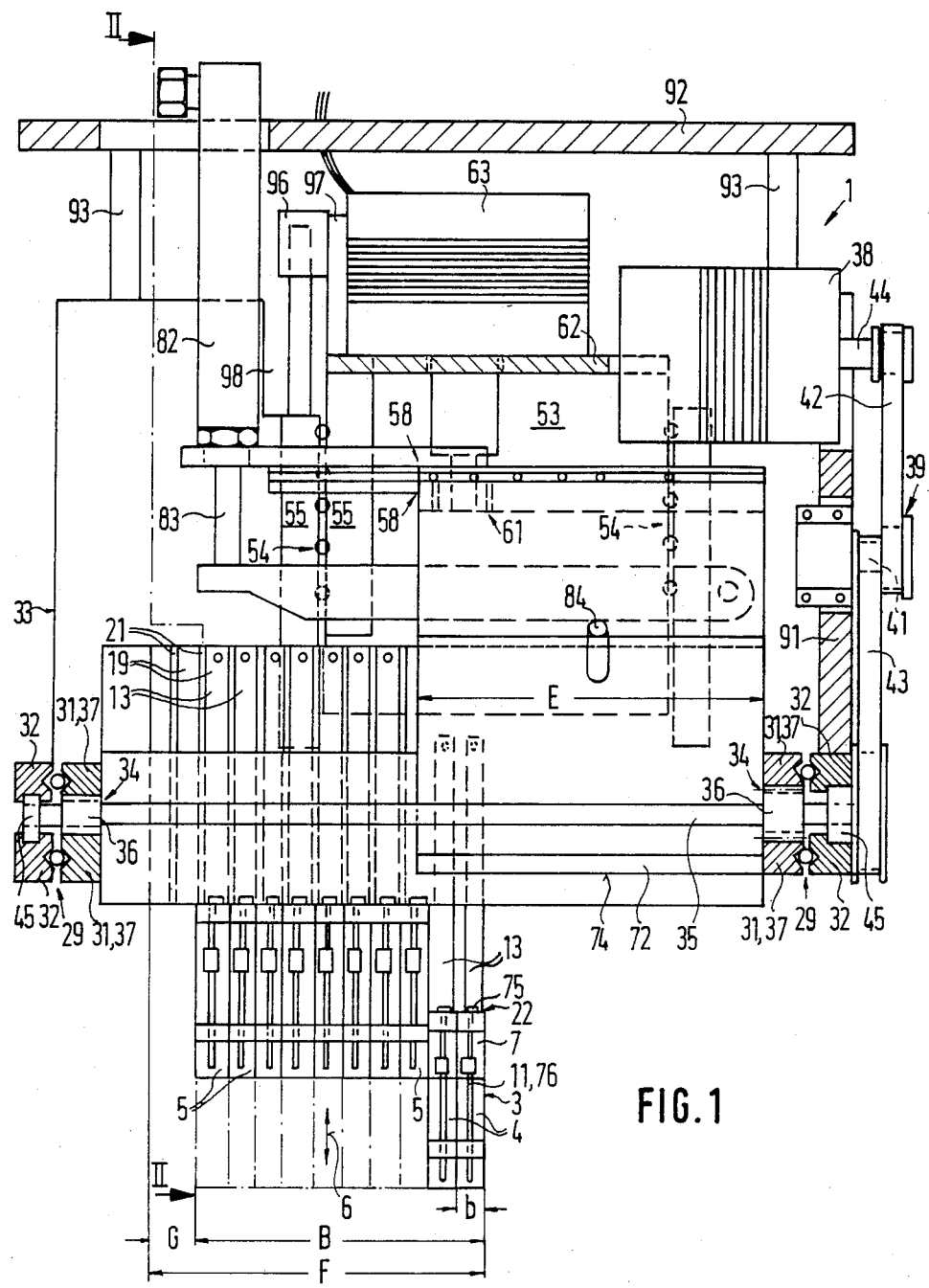
FIG. 1 shows a device formed according to the invention for gripping electronic parts, in a section along the line I—I in FIG. 2.

The device indicated generally in FIG. 1 by 1 serves to pick up electronic parts, particularly IC's indicated by 2, at a pick-up station (not shown), to transport them to an operating station (not shown) and to deposit them at the operating station or to insert them in a predetermined position, for example a mounting position in a circuit board (likewise not shown). To grip the IC's the device 1 has a pincer grip indicated generally by 3 which consists of several pincer sections 4, 5 arranged in a row. While the pincer sections 5 can be moved in a manner to be explained later between a retracted stand-by position (shown in FIG. 1 with full lines) and an advanced operating position (shown in chain lines), the pincer sections are rigidly held in the device 1 in this direction of movement (double arrow 6). The pincer sections 5 are each individually movable into the operating position. In this way width B of the pincer grip 3 can be varied; it can be adapted to the length of the IC, not shown in FIG. 1, so as to grip the IC along the maximum length.

Each pincer section 4, 5 consists of two associated gripping jaws 7, which can be moved laterally towards and away from one another (double arrow 8) in such a way that the gripping jaws 7 are moved towards and away from one another simultaneously and at the same speed. The IC's, which are shown only in FIG. 4, can thus be gripped by a gripping movement of the gripping jaws 7. The whole of the device 1 can be transported by an arm (not shown) in various planes and directions of movement, as required, to the operating station at which the IC 2 (FIG. 4) can be set down after releasing the gripping jaws 7. Accurate setting down or insertion at a predetermined position is possible by disposing the gripping faces 9 of the gripping jaws 7 parallel to one another and parallel to the double arrow 6 and by associating the ejectors 11 with the gripping jaws 7, the ejectors being likewise movable parallel to the double arrow 6. The IC 2 concerned is thus guided during ejection and its contact lugs 12 can also be inserted accurately into small mounting openings, for example in a circuit board (not shown).

Figure 2:
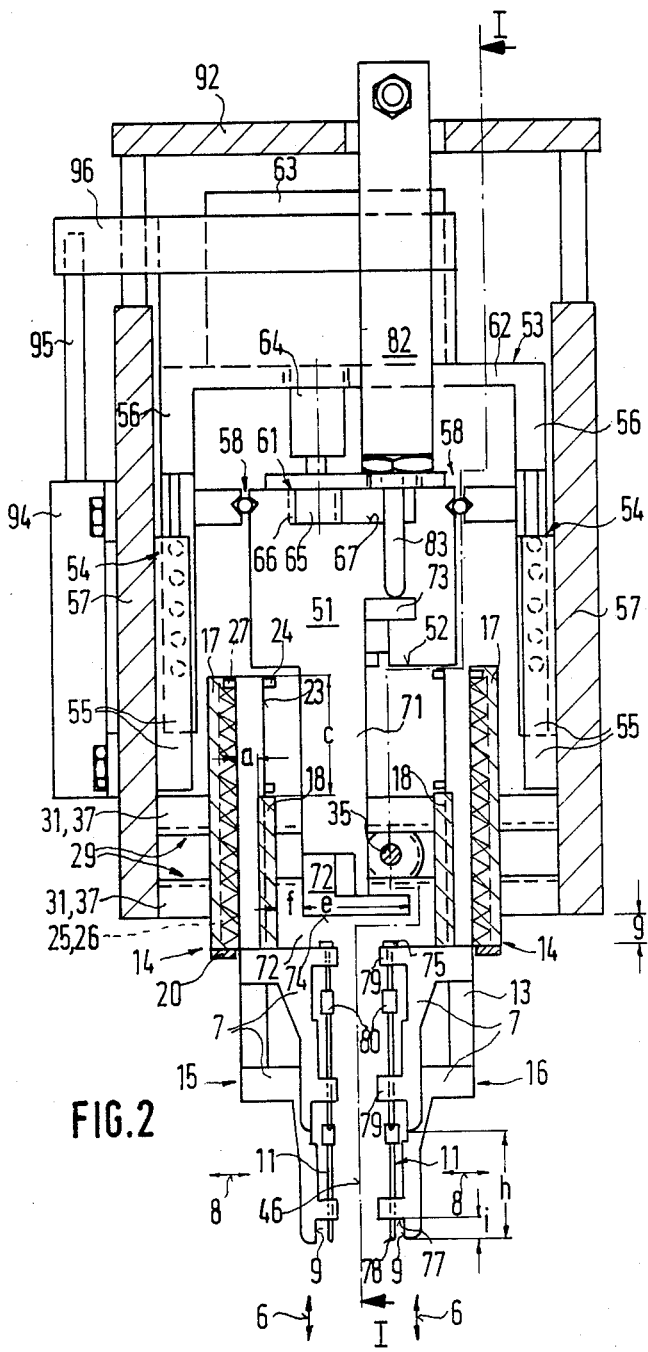
FIG. 2 shows the device according to FIG. 1 in a section along the line II—II in FIG. 1.

The form of the gripping jaws 7 and the ejectors 11 can best be seen from FIG. 2. The gripping jaws 7 are similar to one another and each has a rod 13 which is displaced outwards from the gripping faces 9 and can be moved along the double arrow 6 in a first guide 14. With each row 15, 16 of the gripping jaws 7 a first guide 14 is associated, each guide being formed of guide plates 17, 18 spaced apart by a distance a, the inner guide plate 18 being in each case lower by the amount c than the outer guide plate 17. The gripping jaws 7 are guided between the guide plates 17, 18 by means of their rods 13. The inner guide plates 18 have guide slots 19 or guide flanges 21 to guide the rods 13, which are narrowed at 22 compared with the width b of the gripping jaws 7 by the amount of the guide flanges 21. The arrangement is such that the gripping jaw sections 4, 5 are situated with their facing sides directly adjacent. This is however not essential, since there could also be a space between the individual gripping jaw sections 4, 5.

From each inner side 23 of the rods 13, which—as already mentioned—are displaced outwards with respect to the gripping faces 9, there projects at the upper end a projection 24 which engages with the upper side of the respective inner guide plate 18. The projections 24 thus form stops which define the operating position of the movable pincer sections 5. The stroke h of the gripping jaws 7 thus corresponds approximately to the distance c.

Each gripping jaw 7 is urged by a spring 25 towards its stand-by position. The springs 25 are arranged in slots 26 that are formed in the inner sides of the outer guide plates 17, and each acts against a projection 27 that projects from the outer side 28 of each rod 13. The slots 26 are covered at one end by rails 20 screwed to the guide plates 27, which also support the springs 25.

The first guides 14 are guided in second guides 29 in the direction of the double arrow 8. The gripping or releasing movement (double arrow 8) takes place simultaneously for all the gripping jaws 7 of the rows 15, 16. Hence, the pincer sections 5 that are in the stand-by position also take part in the gripping and releasing movements, although they are not in use. This is however completely without importance, since an arrangement in which only those gripping jaws 7 that were in the operating position took part in the gripping and releasing movement (double arrow 8) would be extraordinarily complicated and require many parts, and would require a substantially larger construction.

The second guides 29 arranged at the two ends of the guide plates 17, 18 are formed by known ball-bearing guides with guide rails 31, 32, of which those indicated by 31 are fixed to the guide plates 17, 18 and simultaneously keep these at a distance, and of which those indicated by 32 are fixed to a housing indicated generally by 33 that will be described later. The drive for the gripping and releasing movements (double arrow 8) of the gripping jaws 7 is effected by a rack and pinion drive indicated generally by 34. This comprises a shaft 35 extending between the first guides 14 and between the guide rails 31, 32 (each present as a pair), having fastened thereto two pinions 36 which cooperate with the inner guide rails 31 which are formed as racks 37. For this purpose the sides of the guide rails 31 that face one another are formed with teeth. The shaft 35 can be driven by a stepping motor 38, a two-stage toothed belt drive 39 with a freely rotating lay shaft 41 being provided between this and the shaft 35. The toothed belts are indicated by 42, 43. The two-stage toothed belt drive 39 is constructed as a reduction gear, i.e. the shaft 35 rotates substantially more slowly than the drive shaft 44 of the stepping motor 38. The shaft 35 is carried in ball-bearings 45 that are housed in recesses in the guide rails 32 on the side of the housing. Associated with each pair of guide rails 31, 32 is a cooperating pair of a first guide 14. That is to say, the lower, inner guide rails 31 are fixed rigidly to the guide block on the left in FIG. 2 (guide plates 17, 18) and the upper, inner guide rails 31 are fixed to the guide block on the right in FIG. 2. By the rack and pinion drive arrangement 34 described above the two guides 14 are each moved simultaneously and at the same speed in opposite directions. Consequently the IC's being held are always gripped in the centre position (central axis 46), irrespective of the width of the IC 2 concerned. To move the pincer sections 5 into the operating position a ram 51 is provided that is movable along the first guides 14 and can act through a pressure face 52 simultaneously on both rods 13 of associated gripping jaws 7. The stroke of the ram 51 is such that it can move the gripping jaws 7 into the operating position by pressure on the upper ends of the rods 13. In operation the ram 51 remains in this position, so that the advanced gripping jaws 7 are fixed in their operating position. After withdrawal of the ram 51 the advanced gripping jaws 7 or pincer sections 5 are automatically returned to their stand-by position by the springs 25. In the drawing the ram 51 is shown in its retracted position. The ram 51 is held on a block generally indicated by 53 which can be moved along the first guides 14 in the housing 33 by means of a third guide 54.

The third guide 54 is formed by four ball-bearing guides with guide rails 55, which are fixed on the one hand to the arm 56 of the U-shaped block 53 (FIG. 2) and on the other hand to plates 57 of the housing 33. The arms 56 engage with the first guides 14 at a distance (FIG. 2) such that the movement of the first guides 14 in the second guides 29 is possible.

The ram 51 is not only movable along the first guides 14, but also along the rows 15, 16 of the pincer sections 4, 5, in a fourth guide 58 which is also formed by a ball-bearing guide with guide rails. The movement of the ram 51 in this fourth guide 58 also results from a rack and pinion drive, indicated generally by 61. For this movement a second stepping motor 63 is arranged on the bridge piece 62 of the block 53, with a pinion 65 on its drive shaft 64 which meshes with teeth 66 on the ram 51 in a groove 67. When the stepping motor 63 rotates the ram 51 is moved towards the left or right, compared with FIG. 1, along the rows 15, 16 of the pincer sections 4, 5. It can thus be moved at will over the pincer sections 5 which are to be advanced into the operating position, in order to form a pincer grip 3 of a given width B. If the ram 51 in the position shown in FIG. 1 were to be advanced towards the gripping jaws 7, it would displace only the first movable pincer section 5 into the operating position. The width E of the ram 51 corresponds to a distance F made up of the width B of the pincer grip 3 and a space G in which further guide slots 19 or guide flanges 21 are arranged to receive further gripping jaws 7. The width B of the pincer grip 3 can—as FIG. 1 clearly shows—be increased by two further pincer sections 5 if need be.

From the pressure face 52 of the ram 51 there projects, approximately in the middle, a flange 71 in which an ejection slide 72 is guided to move parallel to the third guide 54, and thus also parallel to the first guide 14. In the position shown the said guide is in its retracted position, and can be advanced towards the gripping jaws 7 by a rocking movement of a lever 73. The width e of the ejection slide 72 is such that its front end 74 can act on the ejectors 11 that are guided to move in the gripping jaws 7 both in the most widely separated position of the gripping jaws 7 and in their closest position. The distances F between the inner guide plates 18 and the ejection slide 72 enable the gripping jaws to be moved together to a substantial extent, so that narrow IC's 2 can also be gripped. In the completely closed position of the gripping jaws 7 these lie with their facing sides together.

In its advanced position the ejector slide 72 is immediately in front of the heads 75 of the ejectors 11, which consist of push-rods 11. That is to say, in its retracted position the ejection slide 72 is at a distance G from the heads 75 that is greater than the distance in between the stop faces 77 of the gripping jaws 7 and the front ends 78 of the push-rods 76 in its advanced position. The push-rods 76 are free to move in guide bores in the gripping jaws, i.e. they drop under their own weight into the position shown in FIGS. 1 and 2. When an IC 2 is gripped, the push-rods 76 are automatically pushed back into their retracted positions. The push-rods 76 are housed in projections 79 arranged on the sides of the gripping jaws 7 that face one another. Appropriately arranged clamps 80 ensure that the pushrods 76 cannot be pushed so far out that their front ends 78 come out of the guide.

The ejection slide 72 is urged towards its retracted position, as shown. The advancement of the ejection slide 72 is effected by a pneumatic cylinder 82 whose piston 83 can rock the lever 73 towards the gripping jaws 7. When it is rocked, the lever 73 acts on a stop bolt 84 fixed to the ejection slide 72, which carries the ejection slide 72 with it.

The ejection slide 72 has the same width (E) as the ram 51. Since the ejection slide 72 shares in this movement, the ejection slide 72 also covers the same pincer sections 5 as are covered by the ram 51, and can act on their push-rods 76 (see FIG. 1).

The housing 33 of the device 1 consists of a space between enclosing plates that are arranged on four sides of the housing 33. Besides the opposed plates 57 that have already been discussed there are a further plate 91 on the two-stage toothed belt drive 39, which is fixed to these, and a cover plate 92 that is connected by four spacing bolts 93 to the plates 57 so as to provide installation openings between the plates 57, 91 and 92.

To move the ram 51, or the block 53 that carries it, a second pneumatic cylinder is provided on one of the outer sides of the housing 33, having its piston rod 95 connected to a cross-rod 96 that is fixed to an outwardly directed flange of the block 53. For the block 53 to have the required stroke, the plate 57 is cut away at 98 beneath the cross-rod 96.

The advanced position of the ram 51 can be adjusted by means of adjustable stops in the form of set-screws 99, shown only in FIG. 3, that are screwed into stop pieces 100 fixed to the inside of the housing 33.

For handling, the device 1 can be fixed by means of its cover plate 92 to an arm (not shown) which is preferably displaceable or tiltable in several planes and directions. The movement of the arm, and also the individual movements of the parts (pincer sections 4, 5, gripping jaws 7, ram 51, ejection slide 72) of the device, can be controlled automatically by a program.

What is claimed is:

1. Device for gripping electronic parts, said device comprising a pincer grip having gripping jaws which are movable towards and away from one another, said pincer grip being divided into a plurality of pincer sections arranged in a row, at least one of said pincer sections being movable in a first guide between a restricted stand-by position and an advanced operating position and means for moving said rows, together with the plurality of pincer sections contained therein, toward and away from each other.

2. Device according to claim 1, characterised in that the pincer sections are urged elastically towards their stand-by position and are moveable into their operating position by rams.

3. Device according to claim 1, characterised in that associated gripping jaws are moveable between the stand-by position and the operating position and are movable transversely towards and away from one another in a second guide.

4. Device according to claim 3, characterised in that the gripping jaws are moveable towards and away from one another simultaneously and at the same speed.

5. Device according to claim 3, characterised in that the first guide comprises of two independent guides that are moveable in a second guide.

6. Device according to claim 5, characterised in that the first guide is formed of guide blocks that extend along the rows of gripping jaws and each receive all the gripping jaws of one row.

7. Device according to claim 6, characterised in that each of the guide blocks is formed of spaced guide plates, at least one of which has guide formations that cooperate with guide faces on the gripping jaws.

8. Device according to claim 7, characterized in that each guide plate has guide flanges that engage laterally with a guide rod on the gripping jaws.

9. Device according to claim 7, characterised in that at least one guide plate is formed with slots in which are arranged springs that are overlapped at one end by projections of the guide rods into the slots and that are supported at their other end on the guide plates.

10. Device according to claim 3, characterised in that with each first guide there is associated at least one rack that extends parallel to a second guide, the said racks being spaced apart and having arranged between them a driveable pinion that meshes with the racks.

11. Device according to claim 10, characterised in that the second guides are formed of guide rails and that the guide rails associated with the first guides are toothed on the sides that face one another.

12. Device according to claim 10, characterised in that two racks and a pinion are provided at the ends of the first guide and that the pinion is arranged on a through shaft arranged to be driven by a stepping motor.

13. Device according to claim 3, characterised in that associated gripping jaws are movable simultaneously by a common ram.

14. Device according to claim 2, characterised in that each ram is wider than the width of a pincer section, and at least as wide as the width of the gripping jaws, and is moveable in a fourth guide parallel to the row of pincer sections.

15. Device according to claim 1, characterised in that guide rods on the gripping jaws are displaced outwards from associated gripping faces of the jaws.

16. Device according to claim 14, characterised in that the row of pincer sections begins substantially in the middle of the device and that a space as wide as each ram is formed in the device before the first pincer section.

17. Device according to claim 1, characterised in that moveable ejectors for the parts are associated with the pincer sections.

18. Device according to claim 17, characterised in that the ejectors comprise push rods that are housed in the gripping jaws near to their gripping faces.

19. Device according to claim 18, characterised in that the push rods have heads on their ends remote from the part.

20. Device according to claim 18, characterised in that the push rods are housed in projections spaced from one another on the inner sides of the gripping jaws, and that there are shoulders on the push rods between the projections that form stops for the inward movement of the push rods.

21. Device according to claim 17, characterised in that the ejectors of a pincer section are arranged to be moved by an ejection slide moveable parallel to the push rods.

22. Device according to claim 21, characterised in that the ejectors of several of the pincer sections, are arranged to be engaged by a correspondingly wide ejection slide that is moveable parallel to the row of pincer sections.

23. Device according to claim 22, characterised in that the ejection slide is carried by the ram and is displaceably guided in the ram in its ejection movement.

24. Device according to claim 23, characterised in that the ejection slide is movable by a lever that is housed in the ram and is arranged to be operated by a separate drive.

25. Device according to claim 7, characterised in that one of the associated guide plates is formed narrower in the direction of the first guide than the other guide plate and forms, with surfaces that face the free ends of the gripping jaw rods, stops for the outward movement of the gripping jaws.

26. Device according to claim 1, characterised in that the gripping jaws have flat gripping faces disposed parallel to one another and parallel to the direction of advancement of the gripping jaws.

* * * * *